United States Patent
Li et al.

(10) Patent No.: US 10,218,211 B2
(45) Date of Patent: Feb. 26, 2019

(54) DETERMINATION OF Q-FACTOR OF RESONANT TANK NETWORK

(71) Applicant: NXP USA, INC., Austin, TX (US)

(72) Inventors: Gang Li, Shanghai (CN); Huan Mao, Suzhou (CN); Li Wang, Suzhou (CN)

(73) Assignee: NXP USA, INC., Austin, TX (US)

(*) Notice: Subject to any disclaimer, the term of this patent is extended or adjusted under 35 U.S.C. 154(b) by 223 days.

(21) Appl. No.: 15/355,075

(22) Filed: Nov. 18, 2016

(65) Prior Publication Data
US 2017/0271908 A1   Sep. 21, 2017

(30) Foreign Application Priority Data

Mar. 15, 2016 (CN) .......................... 2016 1 0146443

(51) Int. Cl.
| | |
|---|---|
| H02J 7/00 | (2006.01) |
| H02J 7/02 | (2016.01) |
| G01R 27/26 | (2006.01) |
| H02J 50/12 | (2016.01) |
| H02J 50/70 | (2016.01) |

(52) U.S. Cl.
CPC .......... *H02J 7/025* (2013.01); *G01R 27/2688* (2013.01); *H02J 50/12* (2016.02); *H02J 50/70* (2016.02)

(58) Field of Classification Search
CPC .. H02J 50/00; H02J 50/10; H02J 50/12; H02J 17/00; H04B 5/00; H04B 5/0075; H04B 5/0093; H04B 5/0037; B60L 11/182; B60L 11/1831; H01F 38/14

USPC ........................................... 320/108; 307/104
See application file for complete search history.

(56) References Cited

U.S. PATENT DOCUMENTS

| | | | |
|---|---|---|---|
| 5,420,518 A | 5/1995 | Schafer | |
| 6,471,106 B1 | 10/2002 | Reining | |
| 2016/0028248 A1* | 1/2016 | Asanuma | ................ H02J 17/00 307/104 |
| 2016/0146886 A1* | 5/2016 | Finkenzeller | ........ G01R 31/315 324/603 |

FOREIGN PATENT DOCUMENTS

DE        2443069 A1    3/1975

* cited by examiner

*Primary Examiner* — Zixuan Zhou
(74) *Attorney, Agent, or Firm* — Charles E. Bergere

(57) ABSTRACT

A power converter having a switch network, a resonant tank network, and a controller performs in situ determination of the Q-factor of the resonant tank network. The controller excites transitory damped oscillations of the resonant tank network by applying a limited number of ON-pulses to the transistor switches of the switch network. The controller then samples the envelope of the waveform corresponding to the excited transitory damped oscillations and processes the resulting set of digital signal samples to determine the Q-factor of the resonant tank network. The Q-factor determination can be repeated to prevent the power converter from being operated under undesirable operating conditions caused by certain ambient factors, such as the unexpected presence of metal objects in the immediate vicinity of the power converter.

6 Claims, 8 Drawing Sheets

162

150

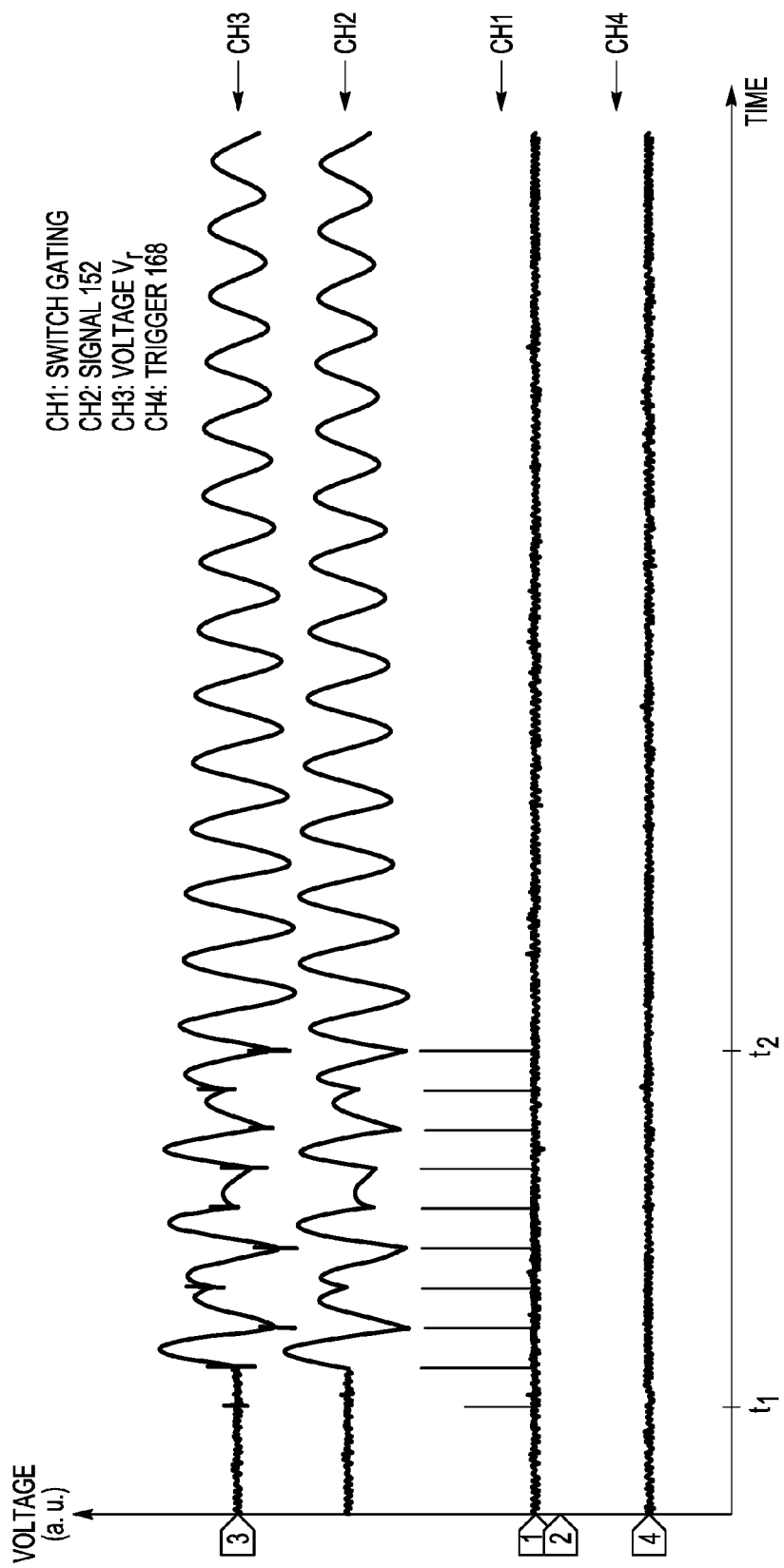

DETERMINATION OF Q-FACTOR OF RESONANT TANK NETWORK

BACKGROUND

The present disclosure relates to power electronics and, more particularly, to circuits and methods for in situ measurements of the Q-factor of a resonant tank network.

DC-DC power converters are used in a variety of applications, such as power supplies for laptop computers and miscellaneous office equipment, wireless charging, aircraft power systems, telecommunications equipment, and DC motor drivers. The input to a DC-DC power converter is an unregulated DC voltage $V_{in}$. The DC-DC power converter operates to produce a regulated DC output voltage $V_{out}$, having a magnitude (and possibly polarity) that differs from $V_{in}$. For example, in a computer power supply, the 120 V utility AC voltage is typically rectified to produce a DC voltage of approximately 170 V. A DC-DC power converter can then be used to reduce the voltage to the regulated 5 V or 3.3 V accepted by the computer's integrated circuits (ICs).

Some DC-DC power converters use resonant tank networks and pulse-width modulation (PWM) to achieve relatively high power-transfer efficiency and/or to reduce the overall size, weight, and cost of the power converter. Such DC-DC power converters are conventionally referred to as resonant converters. In some resonant converter applications, the Q-factor (quality factor) of the converter's resonant tank network must be periodically or occasionally measured to ensure proper operation. For example, in wireless charging, the Q-factor of the converter's resonant tank network needs to be measured to sense a presence of unexpected (and undesired) metal objects.

The Q-factor of a resonator is a dimensionless parameter that provides a measure of the strength of the damping of the resonator's oscillations and also characterizes the resonator's bandwidth relative to its center frequency. According to the conventional definition, a higher Q-factor indicates a lower rate of loss of the energy stored in the resonator. For an electrically resonant system, the Q-factor represents the damping effect of resistive losses. Thus, it is beneficial to be able to determine the Q-factor of a resonant circuit.

BRIEF DESCRIPTION OF THE DRAWINGS

Embodiments of the present invention(s) are illustrated herein by way of example and are not limited by the accompanying figures, in which like references indicate similar elements. Elements in the figures are illustrated for simplicity and clarity and have not necessarily been drawn to scale. Various aspects, features, and benefits of the disclosed embodiments will become more fully apparent, by way of example, from the following detailed description that refers to the accompanying figures, in which:

FIGS. 9-11 are timing diagrams that graphically illustrate various signals generated by the electrical circuit of FIG. 1 during the execution of the methods of FIGS. 7-8 according to an embodiment of the invention.

DETAILED DESCRIPTION

Detailed illustrative embodiments of the present invention are disclosed herein. However, specific structural and functional details to which the disclosure refers are merely representative for purposes of describing example embodiments of the present invention. Embodiments of the present invention may be embodied in many alternative forms and should not be construed as limited to only the embodiments set forth herein.

Disclosed herein are various embodiments of a power converter having a switch network, a resonant tank network, and an electronic controller operable to perform in situ determination of the Q-factor of the resonant tank network. In an example embodiment, the controller excites transitory damped oscillations of the resonant tank network by applying a limited number of ON-pulses to transistor switches of the switch network. The controller then samples the envelope of the waveform corresponding to the excited transitory damped oscillations and processes the resulting set of digital signal samples to determine the Q-factor of the resonant tank network. The Q-factor determination can be repeated as required or necessary, e.g., to prevent the power converter from being operated under unsuitable operating conditions caused by certain ambient factors, such as the unexpected presence of metal objects in the immediate vicinity of the power converter.

One embodiment of the present invention is a machine-implemented method of determining a Q-factor of a resonant tank network of an electrical circuit. The method includes: exciting transitory damped oscillations of the resonant tank network; acquiring an array of digital signal samples that represent a waveform envelope of the transitory damped oscillations; and determining the Q-factor using the array of digital signal samples.

Another embodiment of the present invention is an electrical circuit, comprising: a resonant converter that includes a switch network and a resonant tank network; and a controller operatively connected to the resonant converter, wherein the controller determines a Q-factor of the resonant tank network by: switching the switch network to excite transitory damped oscillations of the resonant tank network; acquiring an array of digital signal samples that represent a waveform envelope of the transitory damped oscillations; and determining the Q-factor using the array of digital signal samples.

Figure 1:
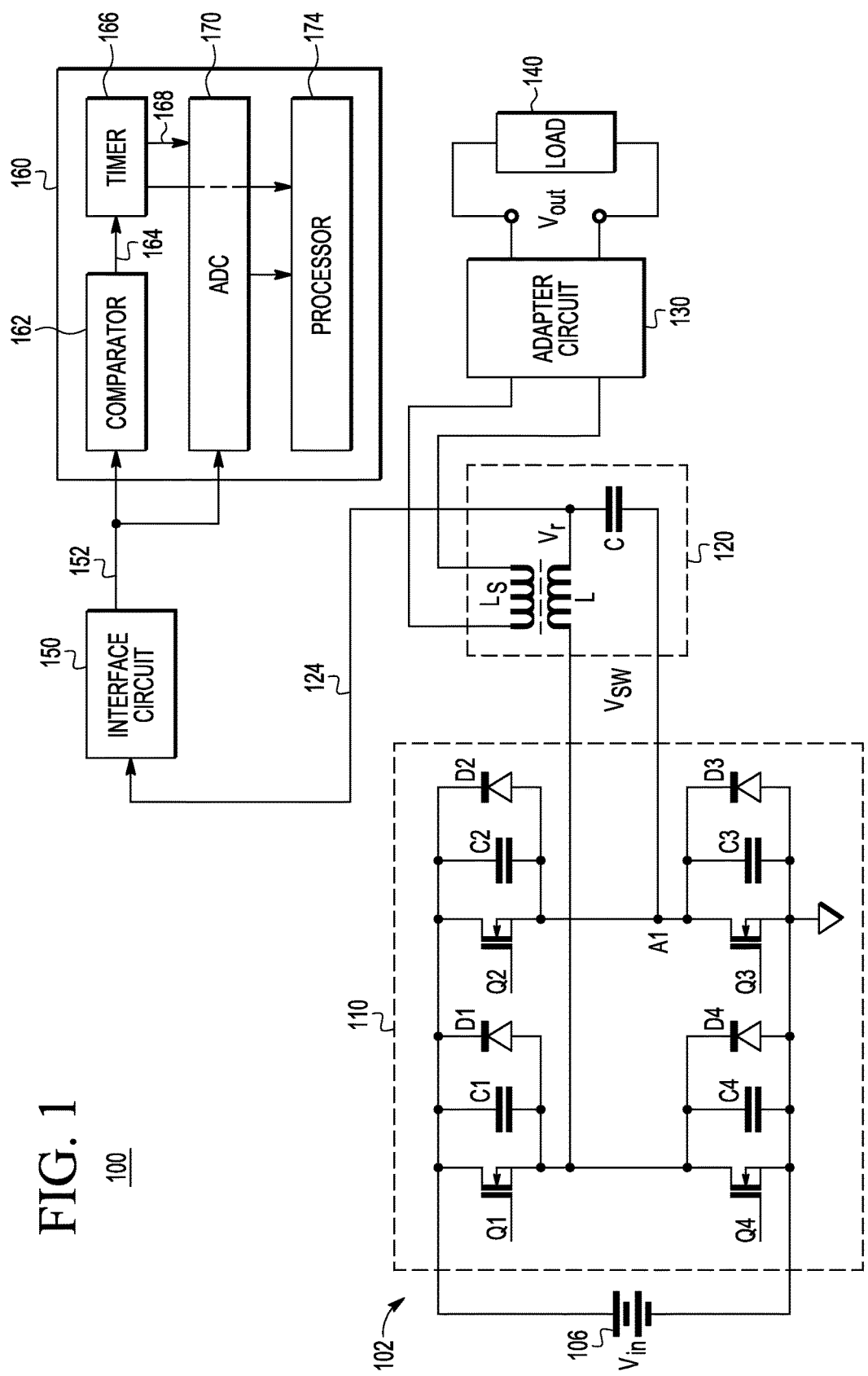
FIG. 1 is a schematic block diagram of an electrical circuit according to an embodiment of the invention.

Referring now to FIG. 1, a schematic block diagram of an electrical circuit 100 according to an embodiment of the invention is shown. The electrical circuit 100 includes a resonant converter 102 that operates as a power supply for a load 140. In particular, the resonant converter 102 operates to convert an input DC voltage ($V_{in}$) into an output voltage ($V_{out}$). Depending on the power requirements of the load 140, the resonant converter 102 can be designed such that the output voltage $V_{out}$ is either a regulated DC voltage or a regulated AC voltage.

In an example embodiment, the resonant converter 102 includes a switch network 110, a resonant tank network 120, and an optional adapter circuit 130 that can be inductively coupled to the resonant tank network 120, e.g., as indicated in FIG. 1, using an auxiliary inductor $L_s$. The adapter circuit 130 can be omitted, e.g., in embodiments in which the resonant converter 102 operates as a DC-to-AC power converter. In embodiments in which the resonant converter 102 operates as a DC-DC power converter, the adapter circuit 130 may include a rectifier and a low-pass filter (not explicitly shown in FIG. 1). In embodiments directed to wireless-charging applications, the adapter circuit 130 may also include a coupler that enables through-space electrical coupling between the resonant converter 102 and the load 140. Some embodiments of the resonant converter 102 may include a voltage source 106. In some alternative embodiments of the resonant converter 102, the voltage source 106 may be a part of external circuits or devices (not explicitly shown in FIG. 1).

In the embodiment illustrated in FIG. 1, the switch network 110 is implemented as a full-bridge inverter having four transistor switches Q1-Q4, each connected in parallel with a respective one of capacitors C1-C4 and a respective one of diodes D1-D4, as indicated in FIG. 1. In operation, the switches Q1-Q4 are turned ON and OFF to cause the full-bridge inverter to convert the input DC voltage $V_{in}$ provided by the voltage source 106 into a square waveform ($V_{sw}$) that is used to drive oscillations of the resonant tank network 120.

In an alternative embodiment (not explicitly shown in FIG. 1), the switch network 110 can be implemented as a half-bridge inverter. A person of ordinary skill in the art will understand that a half-bridge inverter can be obtained from the shown full-bridge inverter, e.g., by (i) connecting the terminal A1 to the ground and (ii) removing the transistor switches Q2 and Q3, the capacitors C2 and C3, and the diodes D2 and D3. In some embodiments, the capacitors C1-C4 and the diodes D1-D4 are optional and can be omitted. A person of ordinary skill in the art will further understand that other alternative embodiments of the switch network 110 (not explicitly shown in FIG. 1) can instead be used in the electrical circuit 100.

The square waveform $V_{sw}$ generated by the switch network 110 drives the resonant tank network 120 to generate a sinusoidal voltage $V_r$ whose frequency is close (but not identical) to the resonant frequency of the resonant tank network 120. In various embodiments, the amplitude of the sinusoidal voltage $V_r$ can be controlled by (i) controlling the switching frequency of the transistor switches Q1-Q4 of the switch network 110 or (ii) with the switching frequency being fixed, controlling the duration of the ON pulses applied to the gates of the transistor switches Q1-Q4. In an example embodiment, the train of ON pulses applied to the gates of the transistor switches Q1-Q4 is characterized by a relatively low duty cycle.

In an example embodiment, the train of ON pulses can be applied to the gates of the transistor switches Q1-Q4 in the following manner. The switch pairs Q1/Q3 and Q2/Q4 are turned ON and OFF such that: (i) in a pulse cycle in which the switches Q1 and Q3 are pulsed ON, the switches Q2 and Q4 remain OFF, and (ii) in a pulse cycle in which the switches Q2 and Q4 are pulsed ON, the switches Q1 and Q3 remain OFF. In the above-described alternative embodiment, in which the switch network 110 is implemented as a half-bridge inverter, the switches Q1 and Q4 are turned ON and OFF such that: (i) in a pulse cycle in which the switch Q1 is pulsed ON, the switch Q4 remains OFF, and (ii) in a pulse cycle in which the switch Q4 is pulsed ON, the switch Q1 remains OFF.

Figure 2:
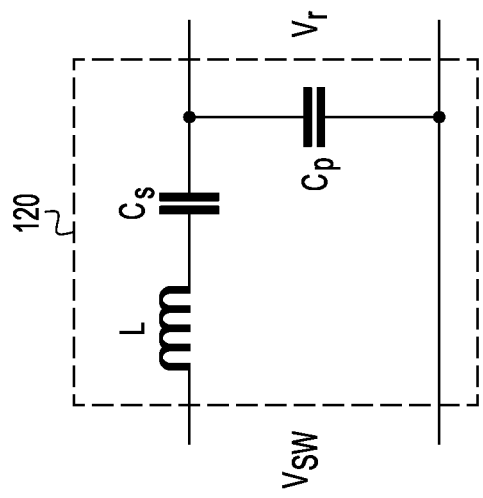
FIG. 2 is a schematic circuit diagram of an alternative embodiment of the resonant tank network of the electrical circuit of FIG. 1.
Figure 3:
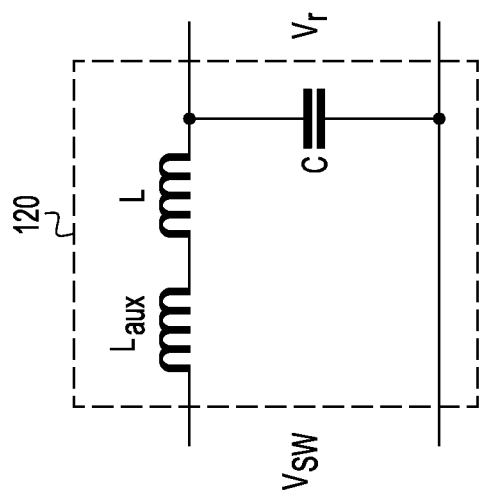
FIG. 3 is a schematic circuit diagram of another alternative embodiment of the resonant tank network of the electrical circuit of FIG. 1.

In the embodiment illustrated in FIG. 1, the resonant tank network 120 comprises the inductor L and a capacitor C that are connected in series. Alternative embodiments of the resonant tank network 120 are illustrated in FIGS. 2-3. A person of ordinary skill in the art will understand that other alternative embodiments of the resonant tank network 120 can instead be used in the electrical circuit 100.

The electrical circuit 100 has the capability to measure the Q-factor of the resonant tank network 120 when such measurement is deemed appropriate or necessary. For this purpose, the output of the resonant tank network 120 is tapped using an electrical line 124 and applied to an interface circuit 150, as indicated in FIG. 1. The interface circuit 150 operates to appropriately condition a copy of the sinusoidal voltage $V_r$ received on the electrical line 124 to make a resulting conditioned electrical signal 152 suitable for digital signal processing in an electronic controller 160. In an example embodiment, the signal conditioning performed by the interface circuit 150 may include, but is not limited to changing the amplitude of the sinusoidal voltage $V_r$ and adding thereto a fixed DC offset voltage. The interface circuit 150 may also serve to provide proper electrical isolation between the controller 160 and the resonant converter 102 in order for the electrical line 124 not to perturb the sinusoidal voltage $V_r$ and the output voltage $V_{out}$. An example embodiment of the interface circuit 150 is described in more detail below in reference to FIG. 4.

In an example embodiment, the electronic controller 160 includes a comparator 162, a timer 166, an analog-to-digital converter (ADC) 170, and a digital signal processor 174. An example embodiment of the comparator 162 is described in more detail below in reference to FIG. 5. In some embodiments, the electronic controller 160 can be implemented as a standalone or imbedded microcontroller unit (MCU) or a digital signal controller (DSC). Example methods for determining the Q-factor of the resonant tank network 120 that can be implemented using the controller 160 are described in more detail below in reference to FIGS. 6-11.

FIGS. 2-3 are schematic circuit diagrams that illustrate alternative embodiments of the resonant tank network 120. In the embodiment illustrated in FIG. 2, the resonant tank network 120 is implemented as an LLC network in which an auxiliary inductor $L_{aux}$, the inductor L, and the capacitor C are connected in series. In the embodiment illustrated in FIG. 3, the resonant tank network 120 is implemented as an LCC network in which the inductor L, a capacitor $C_s$, and a capacitor $C_p$ are connected in series.

Figure 4:
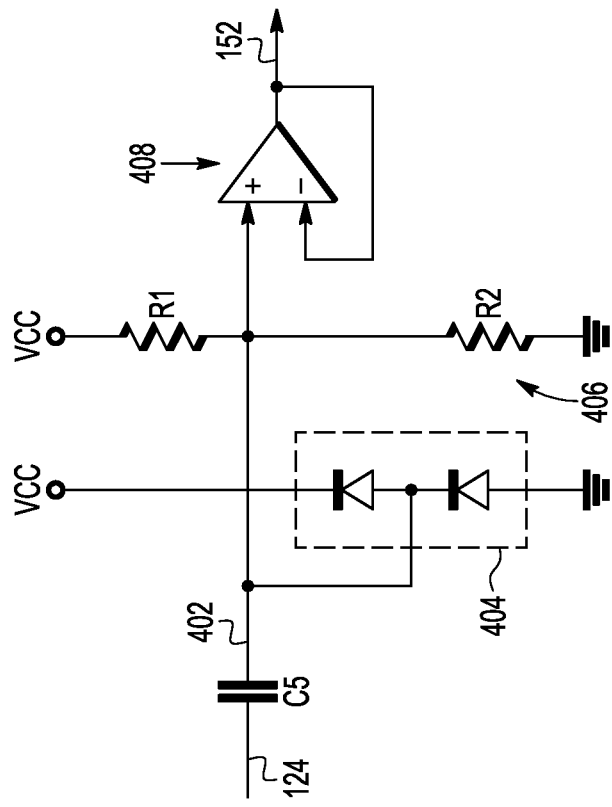
FIG. 4 is a schematic circuit diagram of an interface circuit that can be used in the electrical circuit of FIG. 1 according to an embodiment of the invention.

FIG. 4 is a schematic circuit diagram that illustrates the interface circuit 150 according to an embodiment of the invention. The interface circuit 150 includes a capacitor C5 to which the electrical line 124 (also see FIG. 1) is connected as indicated in FIG. 4. The capacitor C5 operates to provide DC isolation between the remainder of the interface circuit 150 and the resonant tank network 120. In an example embodiment, the capacitor C5 has a capacitance that is significantly smaller than the capacitance of the capacitor(s) used in the resonant tank network 120 (e.g., C, FIG. 1; $C_s$, FIGS. 2-3; $C_p$, FIG. 3), which serves to reduce the influence of the interface circuit 150 on oscillations of the resonant tank network 120.

The interface circuit 150 further includes a voltage divider 406 that comprises serially connected resistors R1 and R2 and operates to apply a DC offset to the AC signal passed by the capacitor C5 onto an electrical line 402. A diode pair 404 will clip the resulting dc-offset waveform carried by the electrical line 402 when the amplitude of that waveform is too large. For example, if the resistors R1 and R2 have the same resistance, then the diode pair 404 will clip the dc-offset waveform carried by the electrical line 402 when the amplitude of that waveform is greater than $V_{cc}/2$, where $V_{cc}$ is the power-supply voltage used in the interface circuit 150. This feature of the interface circuit 150 serves to protect the downstream circuitry, such as an op-amp buffer 408 and the electronic controller 160 (FIG. 1), from possible unsafe signal levels. The output signal generated by the op-amp buffer 408 is the conditioned electrical signal 152 (also see FIG. 1).

Figure 5:
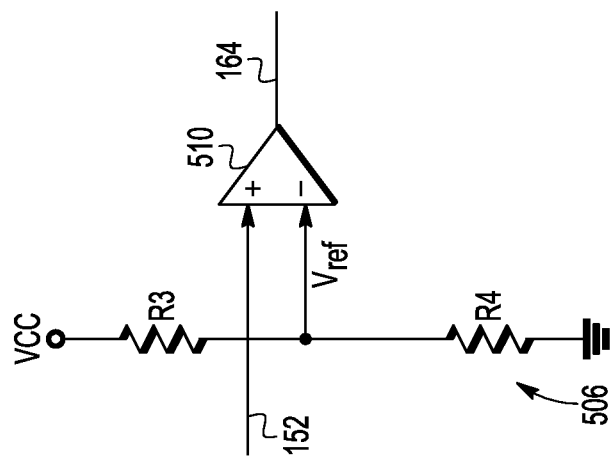
FIG. 5 is a schematic circuit diagram of a comparator that can be used in the electrical circuit of FIG. 1 according to an embodiment of the invention.

FIG. 5 is a schematic circuit diagram that illustrates the comparator 162 according to an embodiment of the invention. The comparator 162 comprises a voltage divider 506 and an operational amplifier (op-amp) 510. The voltage divider 506 comprises serially connected resistors R3 and R4 and operates to provide a reference voltage ($V_{ref}$) to the op-amp 510. The op-amp 510 operates to generate a control signal 164 (also see FIG. 1) in a manner that causes the control signal to be (i) at the logic level "one" when $V_{152} > V_{ref}$ and (ii) at the logic level "zero" when $V_{152} < V_{ref}$, where $V_{152}$ is the instant level of the conditioned electrical signal 152. In an example embodiment, the resistors R3 and R4 have the same resistance, which causes $V_{ref} = V_{cc}/2$.

Referring back to FIG. 1, in general, the switch network 110 can be configured to drive the resonant tank network 120 to cause steady-state oscillations or transitory damped oscillations therein. To cause steady-state oscillations, a continuous train of ON pulses is applied by the electronic controller 160 in the alternating manner to the gates of the transistor switches Q1-Q4, e.g., as described above, with the ON pulses having a fixed repetition rate and a fixed pulse width. In contrast, to cause transitory damped oscillations, the electronic controller 160 applies a finite number of such ON pulses to the gates of the transistor switches Q1-Q4. When the pulses stop, the switches Q3 and Q4 are configured to continuously be in the ON state, and the switches Q1 and Q2 are configured to continuously be in the OFF state. This switch configuration causes the resonant tank network 120 to enter the transitory damped-oscillation mode. In the above-described alternative embodiment, in which the switch network 110 is implemented as a half-bridge inverter, the resonant tank network 120 enters the transitory damped-oscillation mode with the switch Q4 being in the continuous ON state, and the switch Q1 being in the continuous OFF state.

Figure 6:
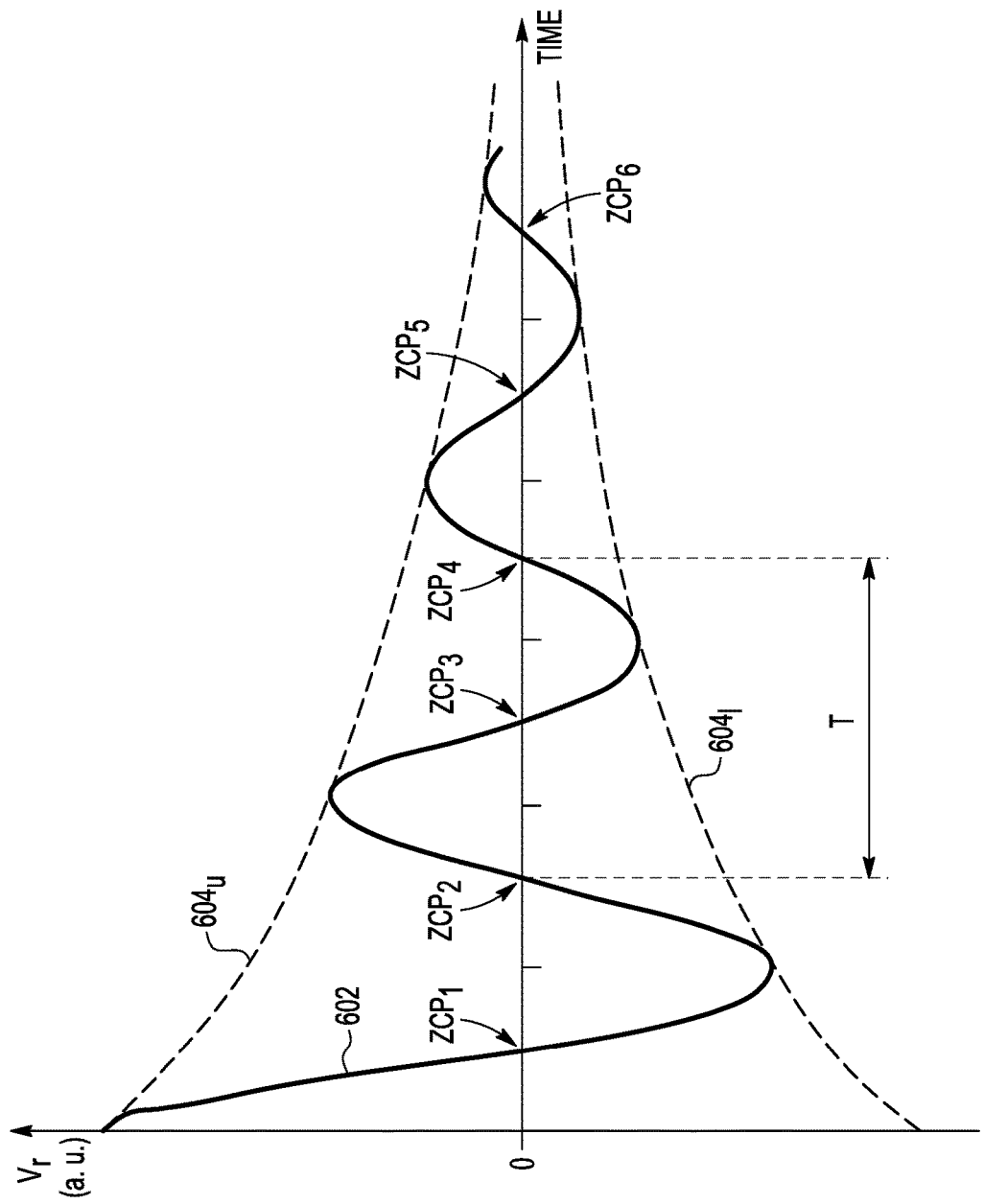
FIG. 6 is a graph illustrating example transitory damped oscillations in the electrical circuit of FIG. 1 according to an embodiment of the invention.

FIG. 6 is a graph that illustrates example transitory damped oscillations of the voltage $V_r$ (FIG. 1) according to an embodiment of the invention. More specifically, FIG. 6 shows an example transitory oscillating waveform 602 that is characterized by an oscillation period (T) and a waveform envelope 604. The oscillation period T can be defined as the time elapsed between two consecutive odd- or even-numbered zero-crossing points (ZCPs) of the waveform 602. As an example, FIG. 6 shows the oscillation period T using two consecutive even-numbered zero-crossing points, $ZCP_2$ and $ZCP_4$. If the resonant tank network 120 has a relatively large Q-factor (which is typically the case), then the waveform 602 has a relatively large number (e.g., >20) of well-defined and discernible ZCPs.

The waveform envelope 604 has an upper edge $604_u$ and a lower edge $604_l$. Each of the upper edge $604_u$ and the lower edge $604_l$ can be approximated by a decaying exponential function, whose decay rate k is related to the damping ratio ζ of the resonant tank network 120 as follows:

$$k = \zeta \omega_0 \quad (1),$$

where $\omega_0$ is the resonant frequency of the resonant tank network 120. The oscillation period T and the Q-factor are related to the damping ratio ζ as expressed by Eqs. (2)-(3), respectively:

$$T = 2\pi/\{\omega_0(1-\zeta^2)^{1/2}\} \quad (2);$$

$$Q = 1/(2\zeta) \quad (3).$$

If the Q-factor is relatively large, then Eq. (2) can be approximated as follows:

$$T \approx 2\pi/\omega_0 \quad (4).$$

It is evident from FIG. 6 that the upper edge $604_u$ of the waveform envelope 604 can be sampled by acquiring samples of the waveform 602 corresponding to the local maxima of the waveform. The lower edge $604_l$ of the waveform envelope 604 can similarly be sampled by acquiring samples of the waveform 602 corresponding to the local minima of the waveform.

Figure 7:
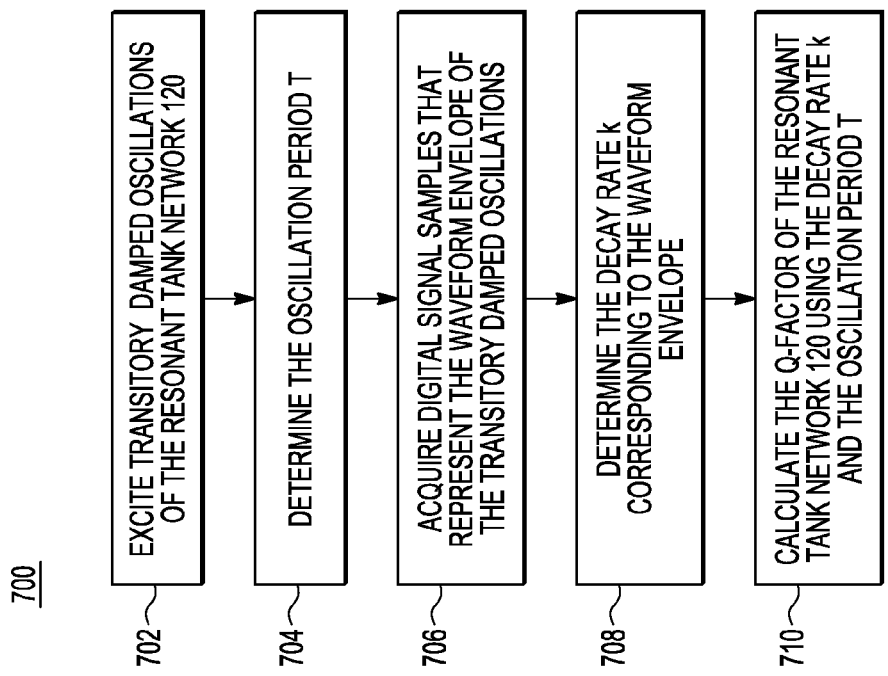
FIG. 7 is a flow chart of a method of determining the Q-factor that can be implemented with the electrical circuit of FIG. 1 according to an embodiment of the invention.

FIG. 7 is a flow chart that illustrates a method 700 of determining the Q-factor that can be implemented in the electrical circuit 100 (FIG. 1) according to an embodiment of the invention. The method 700 is described below in continued reference to FIGS. 1 and 5-7.

Although not explicitly represented in FIG. 1, at step 702 of method 700, the electronic controller 160 applies a predetermined fixed number ($N_1$) of ON pulses to the gates of the transistor switches Q1-Q4 (FIG. 1). As already explained above, after the ON pulses stop, the voltage $V_r$ generated by the resonant tank network 120 undergoes transitory damped oscillations similar to those illustrated in FIG. 6. The interface circuit 150 senses the corresponding transitory waveform of the voltage $V_r$ using the electrical line 124 and applies the corresponding conditioned electrical signal 152 to the electronic controller 160 (also see FIG. 1).

At step 704, the electronic controller 160 processes the conditioned electrical signal 152 to determine the oscillation period T (also see FIG. 6). In an f embodiment, this determination can be carried out using the following sub-steps. First, the comparator 162 is configured to cause the control signal 164 to transition between the "low" and "high" logic levels at the ZCPs (see FIG. 6) of the transitory waveform of the voltage $V_r$. A person of ordinary skill in the art will understand that such a configuration of the comparator 162 can be obtained by properly setting the reference voltage $V_{ref}$ for the op-amp 510 (see FIG. 5). Second, the timer 160 generates a list of the times at which the control signal 164 transitions between the "low" and "high" logic levels and provides the generated list to the processor 174. Third, the processor 174 processes the list of the times received from the timer 160 to determine the oscillation period T.

In some embodiments, the third sub-step of step 704 can be carried out by: (i) calculating a set of time differences between a predetermined fixed number ($N_2$) of consecutive rising edges of the control signal 164; (ii) calculating the average time difference over this set of the time differences;

and (iii) assigning the calculated average time difference to be the determined value of the oscillation period T.

In some embodiments, step 704 is optional and can be skipped.

At step 706, the controller 160 operates to acquire an array E of digital signal samples S that represent the waveform envelope 604 (FIG. 6). In some embodiments, the electronic controller 160 may acquire the array E that represents the upper edge $604_u$ of the waveform envelope 604. As indicated above, such signal samples can be acquired by sampling the corresponding transitory oscillating waveform, such as the waveform 602 (FIG. 6), at the local maxima of the waveform. In alternative embodiments, the controller 160 may similarly acquire the array E that represents the lower edge $604_l$ of the waveform envelope 604. As indicated above, such signal samples can be acquired by sampling the corresponding transitory oscillating waveform at the local minima of the waveform. An example embodiment of step 706 is described in more detail below in reference to FIG. 8.

At step 708, the processor 174 processes the array E of the digital signal samples S acquired at step 706 to determine the decay rate k corresponding to the waveform envelope 604. In an example embodiment, step 708 can be carried out as follows.

Suppose that the array E acquired at step 706 includes M digital values $(S_1, S_2, \ldots, S_M)$ corresponding to the upper edge $604_u$ of the waveform envelope 604. Then, at a first sub-step of step 708, the processor 174 calculates M−1 ratios $R_i=(S_{i+1}-d_0)/(S_i-d_0)$, where i=1, 2, ..., M−1 and $d_0$ is the value of the DC offset introduced by the interface circuit 150 (FIG. 4). For some embodiments of the interface circuit 150, $d_0$ can be zero. At a second sub-step of step 708, the processor 174 calculates the average ratio $R_{avg}$ by summing up the M−1 ratios $R_i$ and dividing the calculated sum by M−1. At a third sub-step of step 708, the processor 174 calculates the decay rate k using the following equation:

$$k=-(\ln R_{avg})/T \qquad (5),$$

where T is the oscillation period determined at step 704. A person of ordinary skill in the art will understand that step 706 can similarly be implemented when the array E includes M digital values $(S_1, S_2, \ldots, S_M)$ corresponding to the lower edge $604_l$ of the waveform envelope 604.

At step 710, the processor 174 calculates the Q-factor using the decay rate k determined at step 708 and the oscillation period T determined at step 704. In an example embodiment, the Q-factor can be calculated by solving Eqs. (1)-(3) with respect to Q. For under-damped systems (i.e., systems characterized by a relatively large value of the Q-factor), the solution of Eqs. (1)-(3) reduces to the following approximation:

$$Q \approx \pi/(kT)=-\pi/(\ln R_{avg}) \qquad (6).$$

Figure 8:
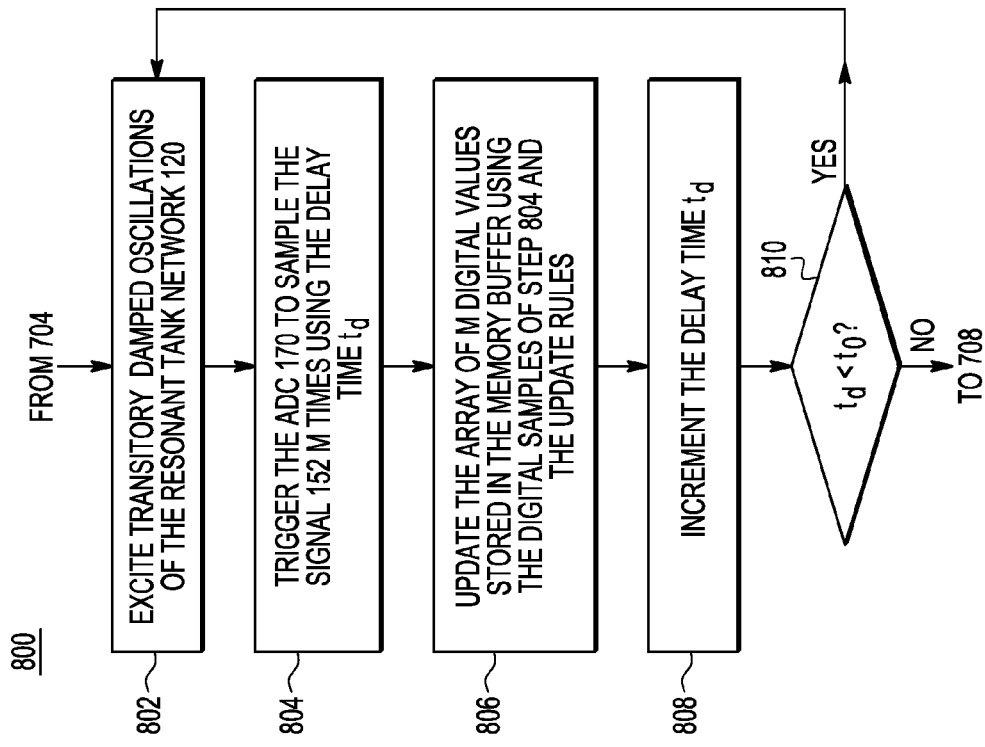
FIG. 8 is a flow chart of a sampling method that can be used in the method of FIG. 7 according to an embodiment of the invention.

FIG. 8 is a flow chart that illustrates a sampling method 800 that can be used to implement step 706 of the method 700 (FIG. 7) according to an embodiment of the invention. The method 800 corresponds to an embodiment of step 706 in which the controller 160 acquires digital signal samples that represent the upper edge $604_u$ of the waveform envelope 604 (see FIG. 6). A person of ordinary skill in the art will readily understand how to modify the method 800 to arrive at a sampling method in which the controller 160 acquires digital signal samples that represent the lower edge $604_l$ of the waveform envelope 604. The method 800, which cycles through steps 802-810 a predetermined number of times, is described below in continued reference to FIGS. 1 and 6-8.

At step 802 of the method 800, the electronic controller 160 operates to excite transitory damped oscillations of the resonant tank network 120 (FIG. 1). In an example embodiment, step 802 can be implemented in the same manner as step 702 of the method 700.

At step 804, the timer 166 is configured to generate a trigger signal 168 (see FIG. 1) that causes the ADC 170 to sample the conditioned electrical signal 152 M times at the times that are delayed from the respective rising edges of the control signal 164 by a delay time $t_d$. Recall that consecutive rising edges of the control signal 164 are separated from one another by the oscillation period T (also see FIG. 6). As a result, the ADC 170 generates M digital samples of the conditioned electrical signal 152 corresponding to M full oscillations of the voltage $V_r$ (FIG. 1).

At step 806, the processor 174 uses the M digital samples generated at step 804 to update an array of M digital values stored in a memory buffer (not explicitly shown in FIG. 1) of the processor 174. In an example embodiment, the following update rules and procedures can be used.

Prior to the first pass of the processing of the method 800 through steps 804 and 806, the memory buffer is purged to delete any digital values previously stored therein.

On the first pass of the processing of the method 800 through steps 804 and 806, the digital values of all M digital samples generated at step 804 are written into the memory buffer as an array.

On each subsequent pass of the processing of the method 800 through steps 804 and 806, each of the M digital samples generated at step 804 is compared with the corresponding digital value of the array stored in the memory buffer. If a digital sample generated at step 804 is smaller than or equal to the corresponding digital value in the array stored in the memory buffer, then the digital sample is discarded. In contrast, if that digital sample is greater than the corresponding digital value in the array stored in the memory buffer, then the value of the digital sample is written into the corresponding position in the array to overwrite the previous digital value at that position.

After the final pass of the processing of the method 800 through steps 804 and 806, the M digital values that end up in the array stored in the memory buffer of the processor 174 form the above-mentioned array $E=(S_1, S_2, \ldots, S_M)$, which is used at step 708 of the method 700 (FIG. 7). The above-described update rules cause the array E generated in the above-described manner to contain digital values, each of which represents the local maximum of the respective one full oscillation of the voltage $V_r$. As already mentioned above in reference to FIG. 6, the local maxima of the waveform 602 provide sampling points of the upper edge $604_u$ of the waveform envelope 604.

At step 808, the present value of the delay time $t_d$ is incremented by Δt. In an example embodiment, the initial delay time $t_d$ used in the first instance of step 804 can be 0.15 T, i.e., 15% of the oscillation period T. The delay-time increment Δt can then be 0.01 T, i.e., 1% of the oscillation period T. With these example parameters used at step 808, the delay time $t_d$ used in the n-th instance of step 804 is described by Eq. (7) as follows:

$$t_d=0.15T+0.01(n-1)T \qquad (7).$$

A person of ordinary skill in the art will understand that, in alternative embodiments, other suitable values of the initial delay time $t_d$ and the delay-time increment Δt can similarly be used.

At step 810, the new value of the delay time $t_d$ is compared with the threshold time $t_0$. If $t_d<t_0$, then the processing of the method 800 is directed back to step 802. Otherwise, the processing of the method 800 is terminated, thereby causing the processing of the host method 700 to move on to step 708 (also see FIG. 7). In an example embodiment, the threshold time $t_0$ can be 0.3 T, i.e., 30% of the oscillation period T. A person of ordinary skill in the art will understand that, in alternative embodiments, other suitable values of the threshold time $t_0$ can similarly be used.

Steps 808 and 810 enable the method 800 to scan the transitory oscillating waveforms analogous to the waveform 602 (FIG. 6) for local maxima. For an oscillation period bounded in time by two respective rising edges of the control signal 164, the respective local maximum is generally expected to occur between 0.15 T and 0.30 T (e.g., see FIG. 6). At least for this reason, in the above-described embodiment of the method 800, the initial delay time $t_d$ and the threshold time $t_0$ are set to be 0.15 T and 0.30 T, respectively.

It should also be noted that sufficient time needs to pass between two consecutive instances of step 802 to cause the earlier transitory oscillating waveform to decay fully before the next transitory oscillating waveform is excited. In an example embodiment, the wait time between two consecutive instances of step 802 can be on the order of 5 ms.

Figure 10:
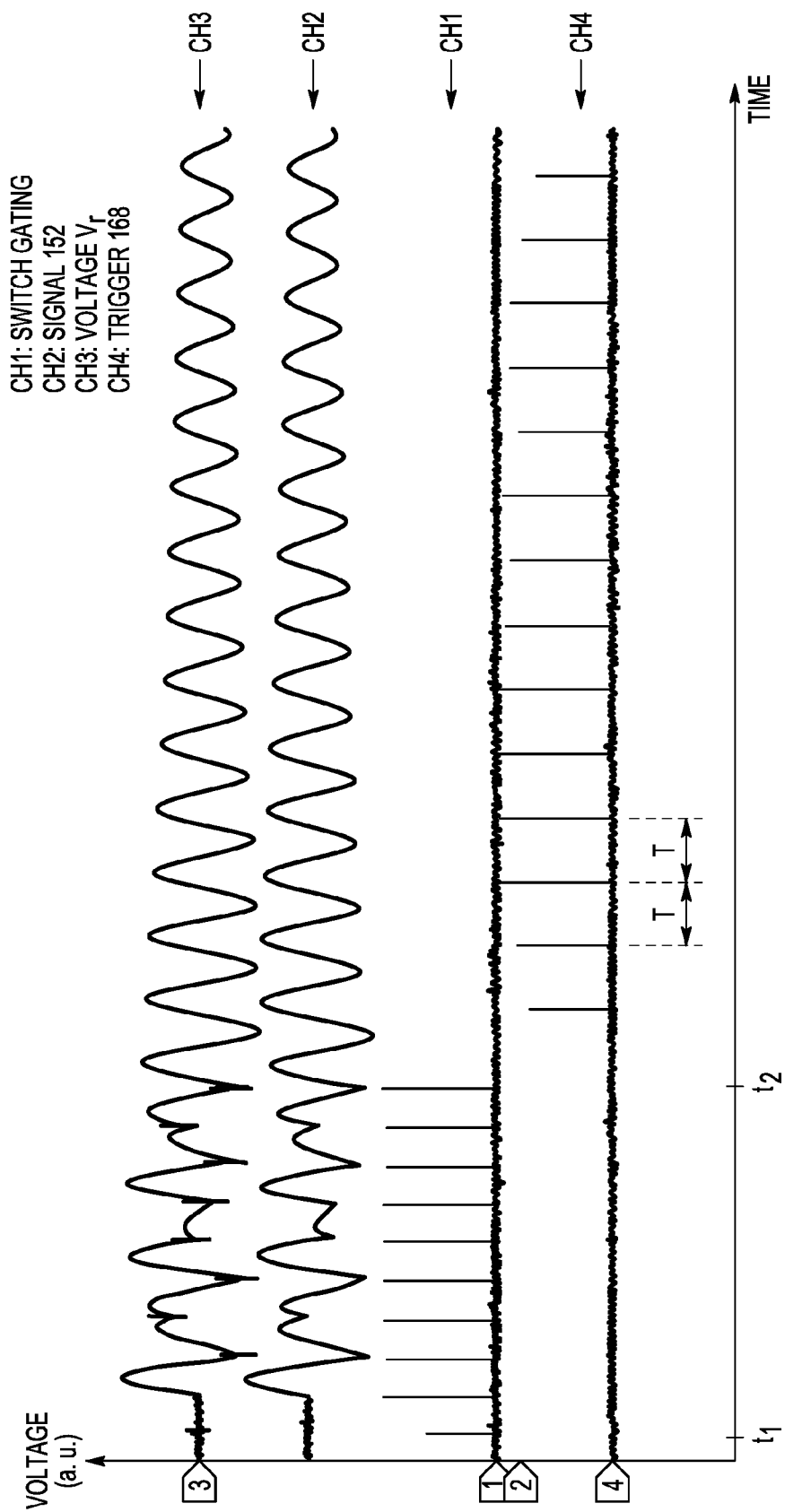
Figure 11:
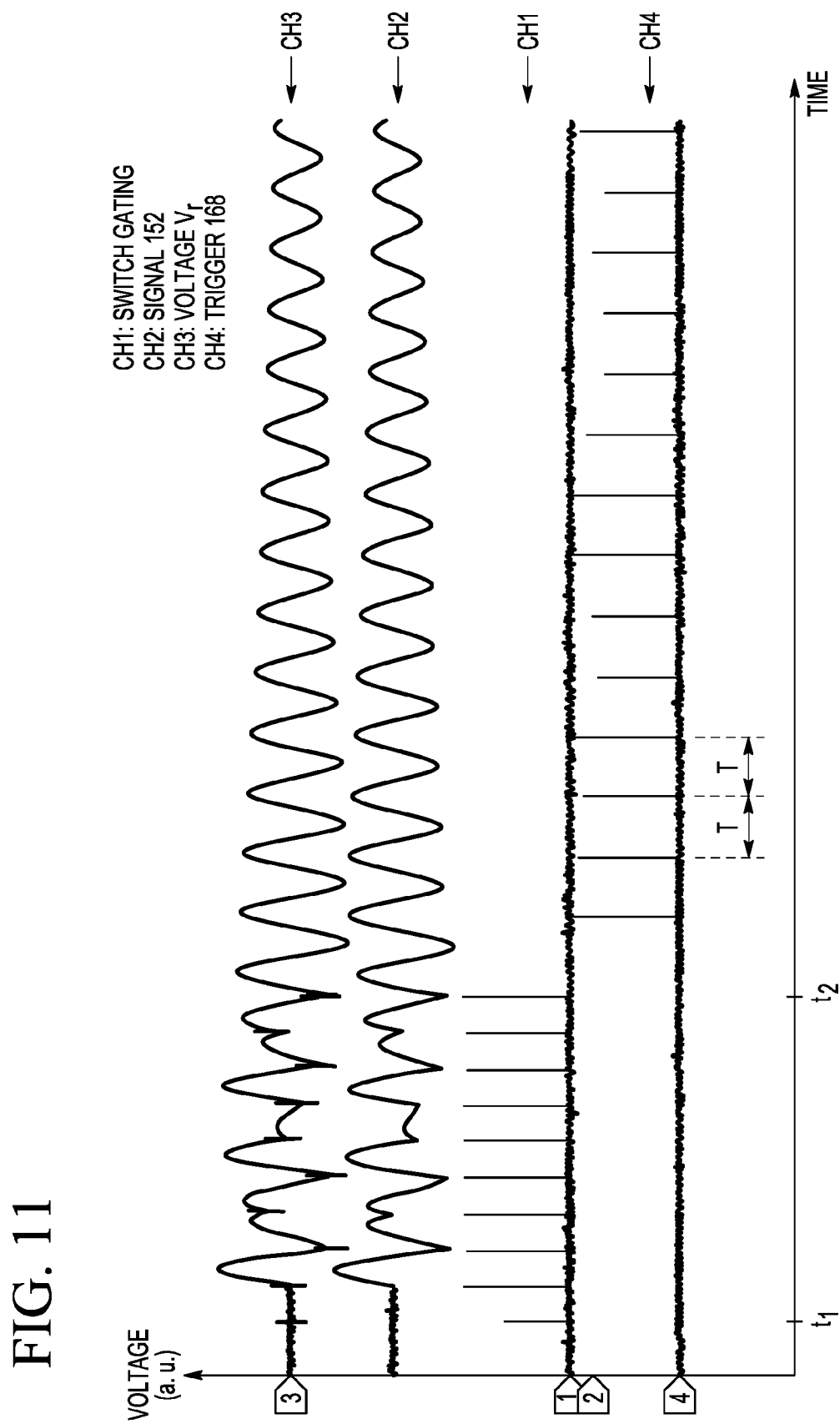

FIGS. 9-11 are timing diagrams that graphically illustrate various signals generated in the electrical circuit 100 (FIG. 1) during the execution of the methods 700 and 800 (FIGS. 7-8) according to an embodiment of the invention. Each of FIGS. 9-11 shows four signal channels, which are labeled CH1-CH4. The channel CH1 graphically shows the train of ON pulses applied to the gates of the transistor switches Q1-Q4 (FIG. 1). The channel CH2 graphically shows the conditioned electrical signal 152 (FIG. 1). The channel CH3 graphically shows the voltage $V_r$ (FIG. 1). The channel CH4 graphically shows the trigger signal 168 (FIG. 1). Each of the numbered pentagonal markers located at the ordinate axis of the graph indicates the zero voltage level for the respective channel. Note that the pentagonal marker number 2 is located significantly lower than the middle portion of the CH2 waveform, which reveals the DC offset imposed by the voltage divider 406 of the interface circuit 150 (see FIG. 4).

FIG. 9 graphically illustrates steps 702-704 of the method 700 (FIG. 7). Before the time $t_1$, $V_r=0$ (see the channel CH3). Between the time $t_1$ and the time $t_2$, ten ON pulses are applied to the gates of the transistor switches Q1-Q4 (see the channel CH1). The frequency of the pulses is selected to be approximately two times higher than the anticipated resonant frequency of the resonant tank network 120 (FIG. 1). No further ON pulses are being applied after the time $t_2$ (see the channel CH1). Between the time $t_1$ and the time $t_2$, the voltage $V_r$ undergoes forced oscillations (see the channel CH3). After the time $t_2$, the resonant tank network 120 enters the transitory damped-oscillation mode, and the oscillations of the voltage $V_r$ are qualitatively similar to the waveform 602 (compare FIG. 6 and the channel CH3). The ADC 170 is not triggered (see the channel CH4), and the processor 174 relies on the above-described list of times (at which the control signal 164 transitions between the "low" and "high" logic levels) received from the timer 160 to determine the oscillation period T at step 704.

FIG. 10 graphically illustrates steps 802-804 of the method 800 (FIG. 8). The waveforms corresponding to the channels CH1-CH3 in FIG. 10 are substantially the same as the waveforms corresponding to the channels CH1-CH3, respectively, in FIG. 9. However, the trigger signal 168 in the channel CH4 of FIG. 10 now carries the ADC trigger pulses used at step 804. In this particular implementation of the method 800, the number of ADC trigger pulses in the trigger signal 168 is M=14. The delay time $t_d$ used in this particular instance of step 804 is 0.15 T. Inspection of the time alignment of the ADC trigger pulses in the channel CH4 with respect to the waveform of the channel CH2 reveals that the transitory oscillating portion (analogous to the waveform 602 of FIG. 6) of that waveform is being sampled at the times that are slightly before the times corresponding to the respective waveform maxima.

FIG. 11 also graphically illustrates steps 802-804 of the method 800 (FIG. 8). However, one difference between FIGS. 10 and 11 is that the fourteen ADC trigger pulses in the trigger signal 168 of the channel CH4 of FIG. 11 correspond to the delay time $t_d=0.25$ T. Inspection of the time alignment of the ADC trigger pulses in the channel CH4 of FIG. 11 with respect to the waveform of the channel CH2 reveals that the transitory oscillating portion of that waveform is being sampled at the times that are slightly after the times corresponding to the respective waveform maxima. This observation indicates that, between the instance of steps 802-804 illustrated by FIG. 10 and the instance of steps 802-804 illustrated by FIG. 11, the transitory oscillating portion of the waveform of the channel CH2 was scanned through the maxima thereof, thereby enabling the controller 160 to compile the array $E=(S_1, S_2, \ldots, S_M)$ in accordance with step 706 of the method 700 (FIG. 7).

It will be further understood that various changes in the details, materials, and arrangements of the parts which have been described and illustrated in order to explain the nature of this invention may be made by those skilled in the art without departing from the scope of the invention as expressed in the following claims.

The invention claimed is:

1. A wireless charger, comprising:
   a resonant converter that includes a switch network and a resonant tank network and generates a sinusoidal voltage signal;
   an interface circuit that conditions the sinusoidal voltage signal; and
   a controller operatively connected to the resonant converter by way of the interface circuit, wherein the controller is operable to determine a Q-factor of the resonant tank network by:
      switching the switch network to excite transitory damped oscillations of the resonant tank network such that the resonant tank network generates the sinusoidal voltage signal;
      acquiring an array of digital signal samples using the conditioned sinusoidal voltage signal that represent a waveform envelope of the transitory damped oscillations; and
      determining the Q-factor using the array of digital signal samples.

2. The wireless charger of claim 1, wherein the controller is a microcontroller unit (MCU).

3. The wireless charger of claim 1, further comprising a DC voltage source, wherein the switch network is coupled between the DC voltage source and the resonant tank network.

4. The wireless charger of claim 3, further comprising an adapter circuit that is operable to provide through-space electrical coupling between the resonant converter and an external load.

5. The wireless charger of claim 1, wherein the switch network includes four transistor switches in a full-bridge arrangement, and
   wherein each transistor switch includes a capacitor connected between the source and drain terminals of the transistor switch and a diode having an input terminal connected to the source terminal of the transistor switch and an output terminal connected to the drain terminal of the transistor switch.

6. The wireless charger of claim 1, wherein the interface circuit comprises:
   a capacitor having a first terminal connected to the resonant tank network for receiving the sinusoidal voltage signal;
   a voltage divider connected to the second terminal of the capacitor for applying a DC offset to an AC signal passed by the capacitor;
   a diode pair also connected to the second terminal of the capacitor for clipping a DC offset waveform at the second terminal of the capacitor; and
   an op-amp buffer having a first input terminal connected to an intermediate node of the voltage divider and an output terminal connected to a second input terminal thereof, wherein the op-amp buffer outputs the conditional sinusoidal voltage signal to the controller.

* * * * *